United States Patent [19]

Menkhoff et al.

[11] Patent Number: 5,717,618
[45] Date of Patent: Feb. 10, 1998

[54] METHOD FOR DIGITAL INTERPOLATION

[75] Inventors: Andreas Menkhoff, Freiburg, Germany; Miodrag Temerinac, Hartheim, Yugoslavia; Franz-Otto Witte, Emmendingen; Martin Winterer, Gundelfingen, both of Germany

[73] Assignee: Deutsche ITT Industries GmbH, Freiburg, Germany

[21] Appl. No.: 509,517

[22] Filed: Jul. 31, 1995

[30] Foreign Application Priority Data

Aug. 8, 1994 [EP] European Pat. Off. ............ 94112339

[51] Int. Cl.$^6$ .................................................. G06F 17/17
[52] U.S. Cl. ................................................... 364/724.1
[58] Field of Search ........................ 364/724.1, 724.01, 364/724.16, 724.17, 723; 324/605, 607, 613–617; 341/50, 61, 122, 123; 375/225, 350

[56] References Cited

U.S. PATENT DOCUMENTS

| | | | |
|---|---|---|---|
| 4,954,824 | 9/1990 | Yamada et al. | 364/724.1 |
| 5,121,065 | 6/1992 | Wagner | 364/724.1 |
| 5,398,029 | 3/1995 | Toyama et al. | 364/724.1 |
| 5,504,785 | 4/1996 | Becker et al. | 375/344 |
| 5,541,864 | 7/1996 | Van Bavel et al. | 364/724.1 |

*Primary Examiner*—Reba I. Elmore
*Assistant Examiner*—Emmanuel L. Moise
*Attorney, Agent, or Firm*—Plevy & Associates

[57] ABSTRACT

An improved method for digital interpolation of signals for a second interpolation filter is disclosed which permits a high signal/noise ratio with a minimum amount of circuitry for an overall system comprising first and second interpolation filters. The method for digital interpolation of signals requires multiplying delayed input values locked to a first signal by corresponding weighting factors which are dependent on a time-difference value determined by the interpolating instant and the time grid of the first clock signal. The weighting factors are determined by an impulse response in the time domain. The associated transfer function has an attenuation characteristic in the frequency domain which, with respect to the stop bands, is limited essentially to the alias regions located at the frequency multiples of the first clock signal. Each of these alias regions is assigned at least two adjacent zeros, or in the presence of double-order zeros, at least one of the alias regions and the associated periodic alias regions are assigned at least one further zero of the transfer function.

19 Claims, 9 Drawing Sheets

METHOD FOR DIGITAL INTERPOLATION

FIELD OF THE INVENTION

The present invention relates to digital filters and more particularly to digital interpolation filters.

BACKGROUND OF THE INVENTION

There are many situations in which it is desired to operate on a given digital signal to produce another signal. For example, operating on a digital signal can filter out some noise, to the extent that it is possible; or can extract signal components within a certain range of frequencies; or predict future values. Such signal processing is generally termed digital filtering.

Interpolation filters are employed as subcircuits in digital circuit systems where an arbitrary change in the sampling rate of digital signals is necessary. Systems which deal only with integral sampling-rate ratios are not a subject matter of the invention. In the case of arbitrary sampling-rate ratios, the signal samples at a first clock rate are to be converted into a sampling sequence which is locked to an arbitrary second clock which in the worst case is even in an irrational frequency ratio to the first clock.

In "IEEE, Transactions on Acoustics, Speech, and Signal Processing", Vol. ASSP-32, No. 3, June 1984, pages 577 to 591, "Digital Methods for Conversion Between Arbitrary Sampling Frequencies" are described in an article by T. A. Ramstad. The associated circuits are referred to as "hybrid systems", which consist of a first interpolation filter with a fixed sampling-rate ratio and a second interpolation filter (analog resampler). The second interpolation filter serves to determine the intermediate values which lie arbitrarily in time between the fixed sample values of the sampling sequence after the second interpolation filter, and thus permit arbitrary sampling-rate ratios. The first interpolation filter contains a combination of an interpolation and a digital filter. With the interpolator, also referred to as an "unsampler", "zero" values are inserted between the original sample values according to an oversampling factor N. With a decimator, original sample values are suppressed if necessary. In both cases, the subsequent digital filter smooths the digital sample values, compensating particularly for the sudden changes to the zero values, so that the spectrum of the desired signal is not distorted by higher frequency components. To this end, the first interpolation filter is designed to form major frequency-range gaps in the spectrum, which extend to infinity. In case of oversampling, too, the frequency spectra are duplicated at one-half the original sampling frequency and multiples thereof. After the interpolator and the digital filter, however, there is a new sampling frequency, also referred as "first sampling clock", which has an integral relationship to the original sampling frequency. The digital filter described above, removes the remaining spectral components between the desired-signal band and the image band (repetition band) at the new sampling frequency and at periodic multiples thereof. The digital filter operates as a digital low-pass filter, which passes the desired range and rejects the frequency components above that range, but according to the sampling theorem, the well-known repetition occurs at half the sampling frequency. Consequently, a digital low-pass filter can not reject the multiples of the sampling frequency.

To implement arbitrary sampling-rate ratios, the spectral components at the new sampling frequency and multiples thereof must be rejected by the second, analog interpolation filter. If these aliasing components are not rejected, aliasing components will be produced in the desired-signal band. The theory of a first interpolation filter is described in an article by R. W. Schafer and L. R. Rabiner, "A Digital Signal Processing Approach to Interpolation", Proceedings of the IEEE, Vol. 61, No. 6, June 1973, pages 692 to 702.

For a second interpolation filter, T. A. Ramstad gives the following possibilities in the above-mentioned article in "IEEE, Transactions on Acoustics, Speech, and Signal Processing", June 1984, pages 577 to 591:

1. A sample-and-hot circuit—this filter has single zeros in the middle of the remaining spectral components at the new sampling frequency. This filter type is also referred to as a simple comb filter.
2. A linear interpolation circuit—this filter has double zeros in the middle of the remaining spectral components at periodic multiples of the new sampling frequency. In this manner, more effective attenuation of aliasing components than with the simple sample-and-hold circuit is achieved. For a signal/noise ratio of 100 dB, for example, this requires an oversampling factor N of 200, which must be implemented by the first interpolation filter. In the above-mentioned reference, an "optimum" interpolation filter is given which makes it possible to reduce the oversampling factor to a value of 164. Even the use of high-order Lagrange interpolation filters, which involves considerable computational complexity, permits no appreciable reduction of the oversampling factor. Both the linear interpolation filter and the Lagrange interpolation filter exhibit a comb-filter response.

EP-A-0 561 067 entitled Sample Rate Converter published on Sep. 22, 1993 also discloses a method using a hybrid system for sampling-rate conversion. This system, however, only operates with an oversampling factor of N=2 and achieves a relatively poor signal/noise ratio. This is permissible, however, since this system is intended for video-signal applications. The second interpolation filter is implemented as a low-pass filter which rejects all frequencies above 1.5 times the value of the original sampling frequency. The analog low-pass response is achieved with a transversal filter in which the weighting factors of the stored sample values are dependent on a time-difference value, henceforth also called "intersample position". Such a low-pass filter rejects not only the remaining spectral components at the multiples of the new sampling frequency, but the entire spectral range above its stop-band edge. For a comparable passband/rejection characteristic, such a low-pass filter requires more costly and complicated circuitry than a corresponding comb-filter arrangement. Although the low-pass filter processes digital, sampled values, it represent in effect an analog low-pass filter, an analog resampler.

From an article by A. Adams and T. Kwan entitled "Theory and VLSI Architectures for Asynchronous Sample-Rate Converters", Journal of the Audit Engineering Society, Vol. 41, No. 7/8, 1993, pages 539 to 555, a method of sample-rate conversion is known which involves, on the one hand, the use of simpler sample-and-hold circuits and, on the other hand, the use of low-pass filters as analog resamplers. For simple systems, sample-and-hold circuits are recommended because of their low complexity, but for more sophisticates systems, the use of a low-pass filter after the first interpolation filter is proposed which rejects the entire frequency range above the desired-signal range.

From the known references it is apparent that after the N-fold oversampling and the filtering in the first interpolation filter, the frequency spectrum contains alias regions whose center frequencies are at multiples of the new sampling frequency. The width of each alias region is equal to twice the bandwidth of the desired signal. If the Nyquist criterion is satisfied for the original digitization, the maximum width of the alias region is determined by a value which corresponds to the original sampling frequency. The locations and widths of all alias regions are defined in the frequency spectrum by the original sampling frequency and the oversampling factor N. The N-fold oversampling of the original sampling sequence causes the relative width of the alias regions, related to the new sampling frequency, to be reduced by a factor of 1/N. This facilitates the separation of the desired-signal band from the respective alias region, since for the second interpolation filter the transition region between the passband and the stop band is increased, so that the amount of circuitry required for the second interpolation filter is reduced. The price paid for this, however, is increased circuit complexity for the smoothing filter in the first interpolation filter.

As a rule, there is either a very complex first interpolation filter, due to high oversampling, and a simple second interpolation filter, such as a linear interpolator, or a simple first interpolation filter, with low oversampling or no oversampling at all, and a very complex low-pass filter, with which the analog resampler is implemented. In the last-mentioned reference, for example, 16,000 known values are stored for the complex low-pass filter.

It is therefore an object of the present invention to provide for the second interpolation filter an improved method for digital interpolation of signals which permits a high signal/noise ratio.

SUMMARY OF THE INVENTION

The present invention provides an improved method for digital interpolation of signals for the second interpolation filter which permits a high signal/noise ratio. This is accomplished with a minimum amount of circuitry for the overall system comprising first and second interpolation filters.

The present inventive method for digital interpolation of signals requires multiplying delayed input values locked to a first signal by corresponding weighting factors which are dependent on a time-difference value determined by the interpolating instant and the time grid of the first clock signal. The weighting factors are determined by an impulse response in the time domain. The associated transfer function has an attenuation characteristic in the frequency domain which, with respect to the stop bands, is limited essentially to the alias regions located at the frequency multiples of the first clock signal. Each of these alias regions is assigned at least two adjacent zeros, or in the presence of double-order zeros, at least one of the alias regions and the associated periodic alias regions are assigned at least one further zero of the transfer function.

BRIEF DESCRIPTION OF THE DRAWING

For a full understanding of the present invention, the above objects and further features and advantages of the invention are described in detail in an exemplary embodiment below in conjunction with the drawing, for which:

FIG. 4 shows the impulse responses of first-order, second-order, third-order, and fourth-order sample-and-hold functions according to the first method a;

DETAILED DESCRIPTION OF THE INVENTION

Figure 1:
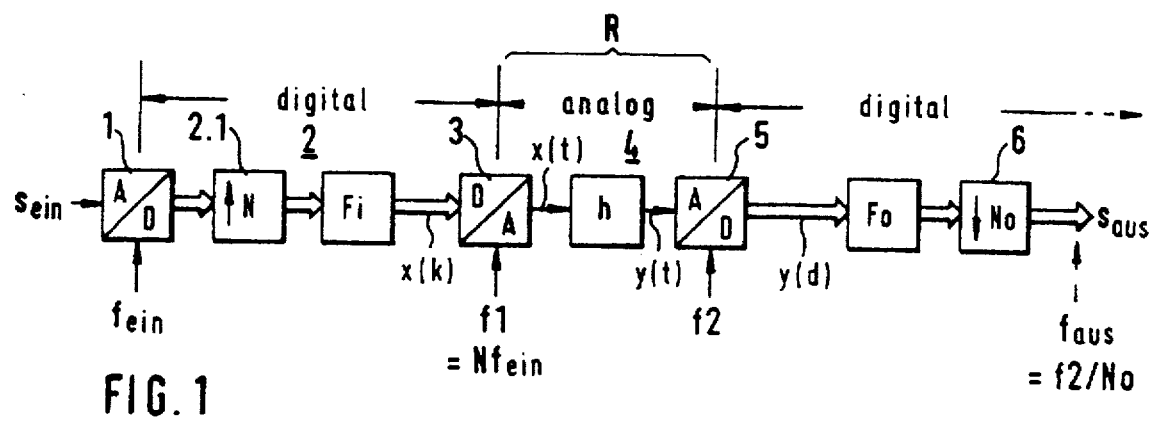
FIG. 1 shows schematically the basic operation of methods for conversion between arbitrary sampling rates.

The present invention provides an improved method for digital interpolation of signals for the second interpolation filter which permits a high signal/noise ratio. This is accomplished with a minimum amount of circuitry for the overall system consisting of the first and second interpolation filters.

In the present invention the signal attenuation of the second interpolation filter, which acts in the manner of a comb filter, is limited to the alias regions at the periodic multiples of the new sampling frequency and allows any signal waveform for the ranges lying therebetween. The transfer function of the second interpolation filter has at least two zeros for each alias region. The at least two zeros in each alias region are located side by side or, if the at least two zeros are a second-order zero, at least one further zero of the transfer function is assigned to at least one of the alias regions. This further zero is preferably placed next to the existing second-order zero to selectively extend the stop band. The at least one further zero produces further zeros at the associated frequency multiples, which, as a rule, lie within the associated periodic alias regions. This results in a further improvement in the attenuation of undesired frequency ranges. In addition, in the passbands of the comb filter, attenuation increases with increasing frequency, so that the position of the zeros within the alias regions becomes correspondingly less critical. The respective transfer function determines the weighting factors of the sample values in the second interpolation filter, the weighting factors, in turn, depending on the respective time-difference value of the sampling instant between the first and second sampling sequences.

The further zeros, or the modification of their positions, can be achieved by the following methods, which are combinable and can be used several times in succession:

a) use of a high-order sample-and-hold circuit, i.e., one with at least triple zeros;

b) shifting and adding the impulse response in the time domain, and forming a resultant, new impulse response; and c) shifting and multiplying the transfer function in the frequency domain, and forming a resultant, new impulse response, whereby at least two zeros lying side by side are produced in each stop band.

The methods according to a) and b) can be implemented with an especially suited filter structure, which will be designated as "Switchable Time-Continuous FIR" (STC FIR).

The time-difference value or the intersample position defines an arbitrary instant between two fixed sampling instants of the first frequency raster. By the method according to the invention, the further zero or zeros can be arbitrarily positioned with respect to the alias regions, so that selective noise suppression is possible. Through a lateral displacement of the zeros the respective attenuation range can be easily modified. By selectively positioning further zeros, the oversampling factor in the first interpolation filter can be reduced from N=200 to N=8, for example, with the second interpolation filter having to combine only 5 sample values. Under these conditions, a signal/noise ratio of 100 dB can be achieved. As a result, the required amount of circuitry or the programming effort for the sample-rate conversion system is greatly reduced, and the clock frequencies remain low.

Referring to FIG. 1 there is shown a block diagram of an arbitrary sampling-rate conversion scheme as is commonly used to explain the method. An analog input signal $S_{ein}$ is digitized by means of an analog-to-digital converter 1, the digitization frequency being $f_{ein}$. The Nyquist criterion must be satisfied, of course, so that the frequency range of the analog signal $S_{ein}$ extends to one half of the sampling frequency $f_{ein}/2$ at the most. The analog-to-digital converter is followed by an interpolation stage 2 which increases the original sampling rate $f_{ein}$ by a factor of N. As a rule, this is accomplished by inserting "zero" values as sample values at the additional sampling instants. Through the digitization at the frequency $f_{ein}$, the desired-signal spectrum is duplicated at one-half the sampling frequency, $f_{ein}/2$, and is repeated between the frequency values $f_{ein}$ and $1.5 \cdot f_{ein}$, and so forth, see FIGS. 3a, 3b, 3c and 3d. The oversampling in an interpolator 2.1 with the integral factor N does not change this periodic repetition of the signal spectrum. However, a digital filter Fi removes from the noise spectra all frequency components lying between one-half of the original sampling frequency and the first alias region at the new sampling frequency $N \cdot f_{ein}$ and between the further alias regions, as far as this is possible. Thus, a signal is available which contains only the frequency range of the useful signal and aliasing components located at the multiples of the new sampling frequency, as shown in FIGS. 3a, 3b, 3c and 3d. If this signal is converted back with a digital-to-analog converter 3 operating at the sampling frequency $f1=N \cdot f_{ein}$, and then subjected to suitable smoothing, approximately the original signal waveform $s_{ein}$ is present again. The digital-to-analog converter 3 theoretically produces analog values x(t) only at the infinitely short sampling instants of the frequency f1. These analog values are converted into a continuous signal y(t) by a smoothing filter h. Therefore, the smoothing filter h, which is an essential part of the second interpolation filter 4, can also be called an "analog interpolation filter".

For an understanding of the sample-rate conversion it must be assumed that the signal y(t) after the smoothing filter h is as equal to the input signal $s_{ein}$ as possible, i.e., that all desired-signal components and no aliasing components are present. A different scaling factor is irrelevant. If these conditions were ideally fulfilled, the continuous signal y(t) could be digitized by means of a second analog-to-digital converter 5 at an arbitrary second sampling rate f2. The digitized values would provide a second digitized sampling sequence y(d). If the signal y(d) is to be subsequently processed at lower sampling frequency $f_{aus}$, the analog-to-digital converter 5 will be followed by a digital low-pass filter Fo and a decimating stage 6, whereby the sampling rate f2 is reduced by the integral ratio No. The output signal $s_{aus}$ is assigned the sampling frequency $f_{aus}$, which is given by $f_{aus}=f2/No$.

From FIG. 1 it can be seen that the accuracy of the sampling-rate conversion is essentially dependent on the accuracy of the signal y(t), and this signal, in turn, depends on the characteristics of the smoothing filter h and the digital filter Fi. In a practical implementation, of course, the analog resampler R will not be of the design shown, since it requires an additional digital-to-analog and analog-to-digital conversion for the analog smoothing filter h. As described above, analog smoothing techniques are known which manage with single sample values and generate the necessary intermediate values by interpolation. The simplest case is the simple sample-and-hold circuit (latch), which holds the last sample value of the sequence x(k) until the new sample value is present. An improvement is provided by the linear interpolator, which stores the last two sample values and forms an intermediate value therefrom by linear interpolation at the desired, intermediate interpolation time tP. Other known smoothing filters are highly complex low-pass filters or the Lagrange filter. Since with all of these filters the intersample position is arbitrarily selectable, an analog filter is thus implemented digitally, hence the designation "analog resampler".

Figure 2:
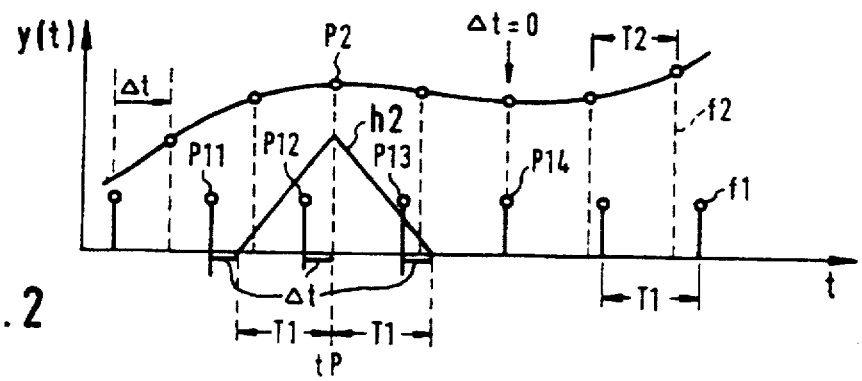
FIG. 2 illustrates the sampling-rate conversion by a signal section in the time domain.

The simplified diagram of FIG. 2 shows the continuous signal y(t) versus time t, together with the first sampling sequence f1 and the second sampling sequence f2. A new sample value P2 is to be formed for the instant tP. With the analog resampler R of FIG. 1, this is accomplished simply by means of the second analog-to-digital converter 5, which is clocked by the second sampling clock f2 at the instant tP. Without the use of the analog resampler R, however, the sample value P2 must be interpolated from the adjacent sample values P11, P12, P13, P14 of the first sampling sequence, and thus be calculated. The directly preceding sample value P12 and the interpolation time tP determine a time-difference value Δt (in the following description, the designation "dt" is mostly used for this value) which serves to calculate the interpolated sample value P2. In the case of a linear interpolation, this time-difference value determines the proportion factor of the two adjacent sample values P12 and P13. For the linear interpolation, the further sample values P11 and P14 and all further values are of no interest. The time-difference value dt relates to the period T1 of the first sampling clock f1, of course. In the time format, the linear interpolation presents itself as a symmetrical, triangular impulse response h2(t) in the time domain, with the axis of symmetry defined by the interpolating instant tP. The temporal width of the impulse response h2(t) covers two sampling periods T1, and thus two stored sample values. The proportion or weighting factor follows from the intersection point of the sample values P12 and P13 with the impulse response h2(t). In FIG. 2, the sample point P14 of the first sampling clock f1 coincides with a sample point of the second sampling clock f2, so that the time-difference value dt is zero there. The calculation of the respective proportion factor is, in all cases, independent of the frequency of the second sampling clock f2. Only the interpolation time tP is relevant for the calculation.

FIGS. 3a, 3b, 3c and 3d show schematically a few frequency spectra belonging to FIG. 1. According to the Nyquist criterion, the useful signal has a maximum bandwidth of $B=f_{ein}/2$. This corresponds to a twofold bandwidth Bs in the case of the alias regions 1S, ... pS, which are centered about the frequency multiples of the first sampling clock f1. In the first line, FIG. 3a, dashed lines indicate frequency spectra which lie between the desired-signal band and the respective alias regions and result from the duplication at one-half the original sampling frequency, $f_{ein}/2$. There is no change through the oversampling with the factor N. However, the dashed frequency ranges are to be attenuated as perfectly as possible by the digital filter Fi. The digital filter Fi is thus a typical digital low-pass filter, whose frequency is duplicated at one-half the sampling frequency, f1/2.

Figure 3A:
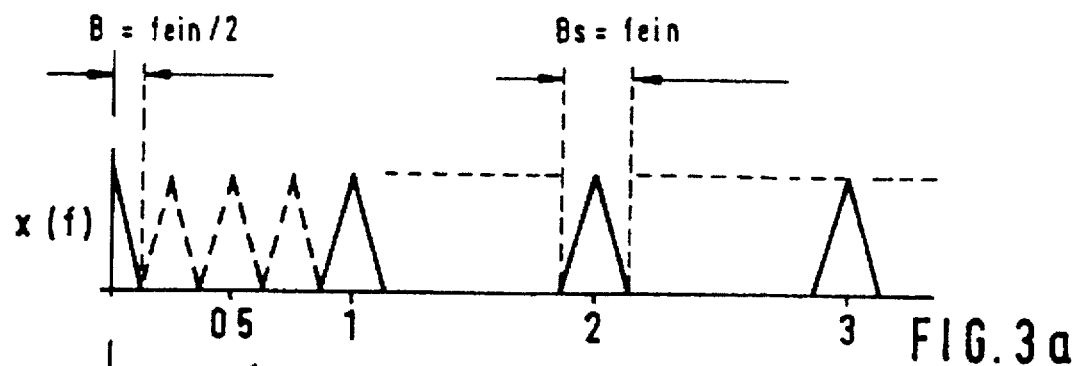
FIGS. 3a, 3b, 3c and 3d shows schematically the frequency spectra which occur during arbitrary sampling-rate conversion.
Figure 3B:
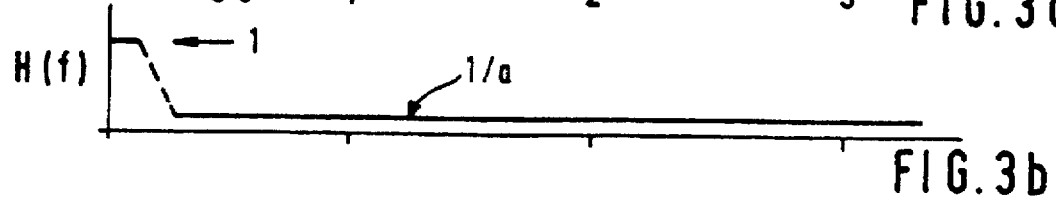
Figure 3C:
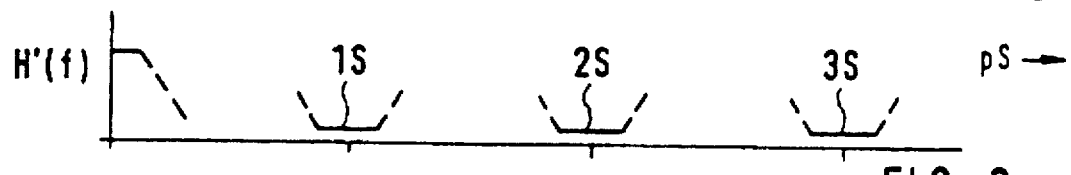
Figure 3D:
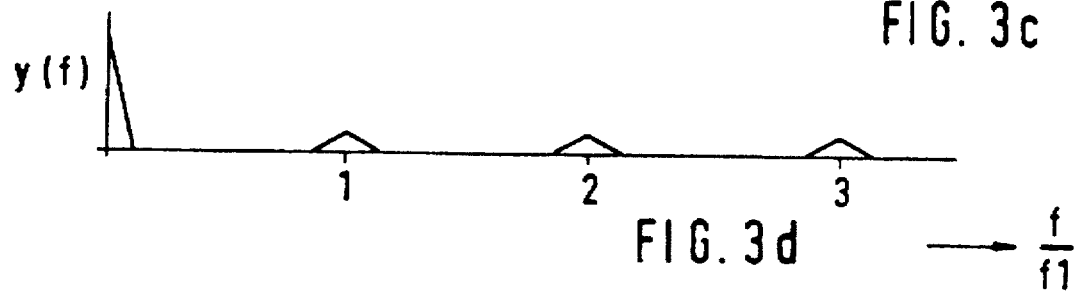

In the second line, FIG. 3b shows the frequency response, and thus the transfer function H(f) in the frequency domain, of an ideal—and thus analog—low-pass filter which, used as the interpolation filter 4, rejects all noise signals above the desired-signal band B. The third line, FIG. 3c, shows the desired frequency response H'(f) of a smoothing filter h, which, according to the invention, acting like a comb filter, rejects essentially only the periodic alias regions 1S, 2S, ... pS, ... The attenuation characteristic in the intermediate ranges is irrelevant if the latter were sufficiently attenuated by the digital filter Fi. The last line, FIG. 3d, shows schematically the spectral distribution y(f) of the interpolated signal y(t), which contains only small signal residues in the individual alias regions, which should be less in magnitude than the desired signal/noise ratio. Instead of the designation H(f), the equivalent designation H($\omega$) will be used in the following equations, where $\omega=2\cdot n\cdot f$.

Therefore it has been assumed that in such interpolating circuits for high-performance systems, the analog resampler R must be a high-quality low-pass filter which rejects all signal components above the desired-signal band B. According to the invention, however, the filtering of the digital signals in the second interpolation filter 4, henceforth called "interpolation filter" for simplicity, is done using methods which, like comb-filtering techniques, are restricted essentially to the alias regions. Measures to improve the filtering action which take this approach in accordance with the invention are highly effective in improving the overall characteristics of the system. Minor degradations in the transfer characteristic of the desired-signal band are negligible when compared with improvements in signal/noise ratio. Nor is it important for the method according to the invention that the original sample values continue to form part of the signal waveform y(t) after the interpolation, as is the case with the Lagrange method, for example.

Figure 4:
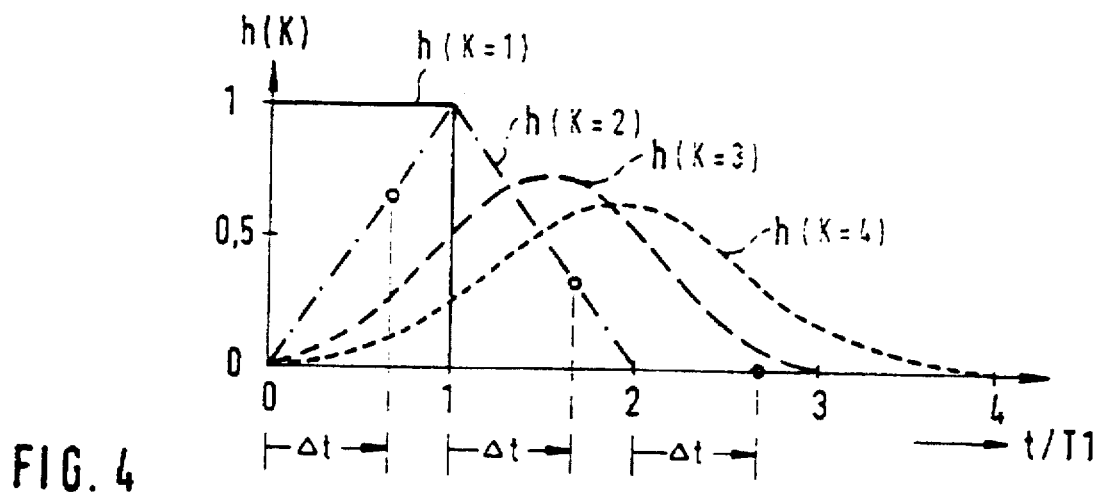

FIG. 4 shows schematically, in the time domain, the impulse responses h(K=1) and h(K=2) of the sample-and-hold functions of first order K=1 and second order K=2, which correspond to the prior art sample-and-hold circuit and the prior art linear interpolator, respectively. Also shown are the impulse responses h(K=3) and h(K=4) for the sample-and-hold circuits of third order K=3 and fourth order K=4, respectively, with which the method according to the invention can be implemented. It can be seen that depending on the order K of the sample-and-hold function, the gating window covers one, two, three, or four sample values of the first sampling sequence, which must be stored in the interpolator 4. The associated weighting factors are determined from the time-difference value dt and the point of intersection with the respective impulse response.

The impulse response hn(t) of an nth-order sample-and-hold circuit is defined by $$hn(t) = \frac{1}{(n-1)!} \times \sum_{k=0}^{n} \left[ \binom{n}{k} \times (-1)^k \times (t-kT1)^{n-1} \times \sigma(t-kT1) \right]$$

where n in hn(t)=order of the central zeros of the associated transfer function Hn(f) in each alias region 1S, 2S, ... pS, ...
k=running numerical value for the addition, which assumes the values zero to n $\binom{n}{k}$ = associated binomial coefficient 94 (t) and $\sigma(t-kT1)$=unit step at instant t and unit step at instant t-kT1, respectively.

Figure 5:
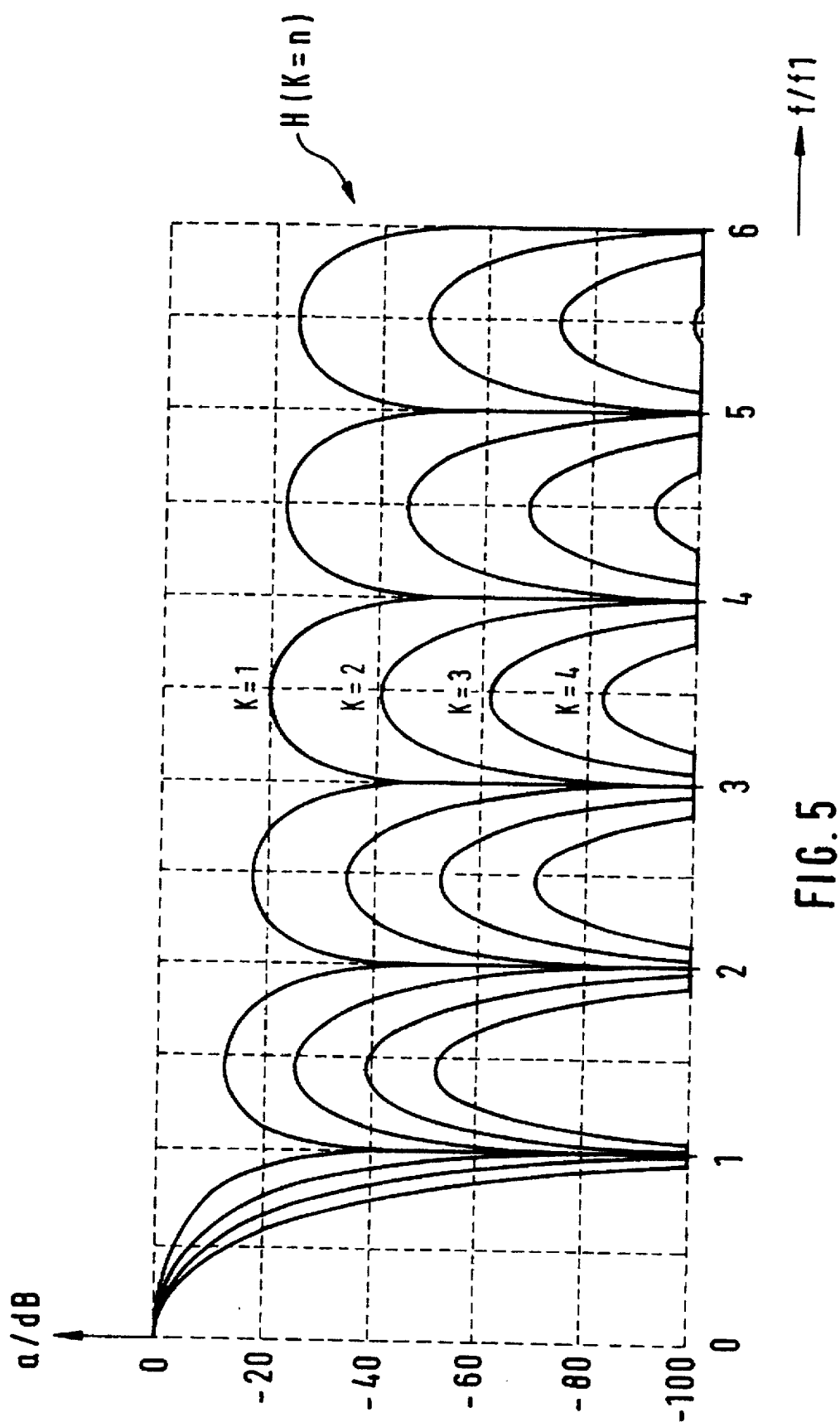
FIG. 5 shows the transfer functions corresponding to the higher-order sampling functions.

The frequency characteristics of a few transfer functions H(K=n) are shown in FIG. 5. With the parameter K the frequency response of a sample-and-hold circuit with 1 to 4 zeros is illustrated. The greater the number K of zeros, the greater the attenuation in the stop bands. When looking at a predetermined signal/noise ratio, e.g., 80 dB, one can see that the respective stop bands widen as the number K of zeros increases. Independently thereof, at a fixed K-value, the stop bands increase in width with increasing frequencies. Most critical for the interference response are the alias regions at low frequencies. However, these can be selectively provided with additional zeros by the method described above.

By the method according to the invention, it is possible to change each impulse response h(t) so that at least one further zero can be selectively positioned by a shift. From the shift in theorem of the Fourier transform it follows that $$f(t-ta)o => e^{-j\omega ta} \cdot F(\omega)$$

and adding the original function f(t) gives $$f(t)=f(t-ta)o => 2e^{-j\omega ta/2} \cdot \cos(\omega ta/2) \cdot F(\omega)$$

This formula contains a cosine function cos(ta·$\omega$/2) which has periodic zeros. Since in the formula the Fourier-transformed signal waveform F($\omega$) is multiplied by the cosine function cos(ta·$\omega$/2), the product contains the zeros of both F($\omega$) and the cosine function. By predetermining the time shift ta, the first zero of the cosine function can be placed so that $\omega=\omega_{alias}$. That is the case for ta=½$f_{alias}$.

According to these considerations, the new impulse response h(t), which stems from the original impulse response $h_{old}$(t), is obtained by additive combination of the two time-shifted original impulse responses:

$$h(t)=h_{new}(t)=h_{old}(t)+h_{old}(t-ta).$$

Figure 6:
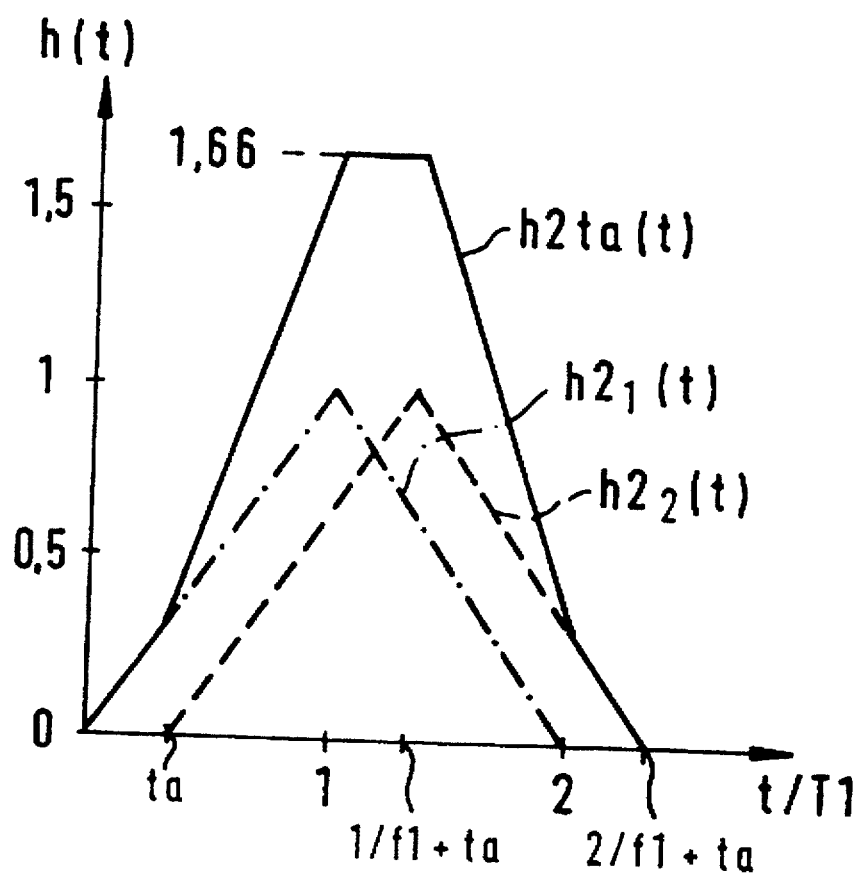
FIG. 6 shows the impulse responses according to the second method b, which relates to a shift in the time domain.

By this method, the resultant impulse response h(t)=h2ta(t) of FIG. 6 is formed from a superposition of two time-shifted impulse responses hs2$_1$(t) and h2$_2$(t) of a linear interpolator h(K-2). The method of superposition used is an addition of the two original impulse responses to the new impulse response h2ta(t). The sampling window of the new function has become greater and may cover up to three sampling values of the first sampling sequence x(k). Of course, arbitrary impulse responses h(t) can be subjected to the same operation to selectively position further zeros. For example, the resultant impulse response of FIG. 6 can, in turn, be combined with a like, time-shifted impulse response to selectively position a second further zero.

Figure 7:
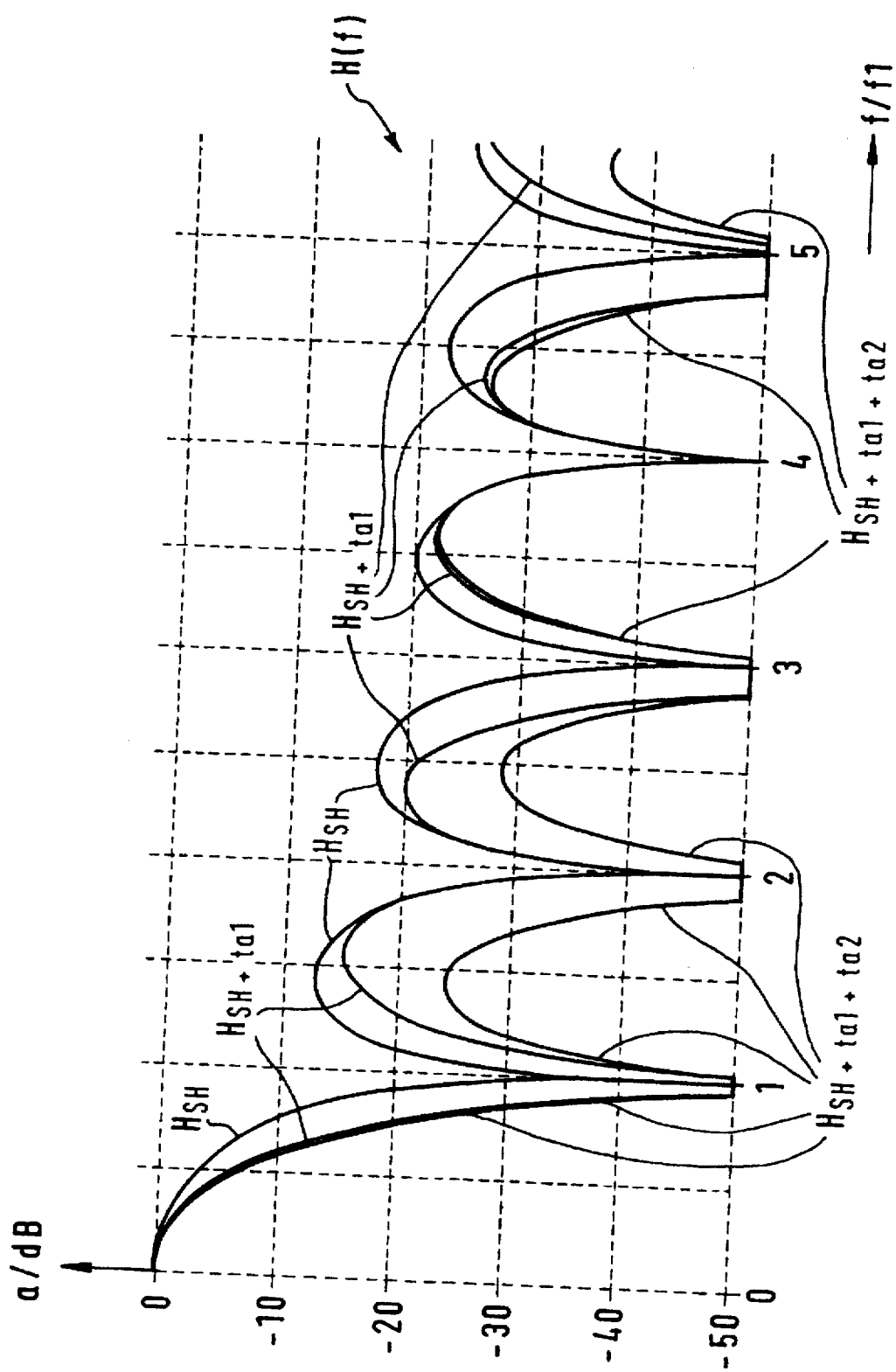
FIG. 7 shows the transfer functions for the time shifts $ta=T/2$, $T/4$, and $T/8$.

FIG. 7 shows, by way of example, three transfer functions of a sample-and-hold circuit for different time shifts. As a reference, the simple sample-and-hold circuit of first order $H_{SH}$ is used. After a first time shift by ta=ta1, the curve $H_{SH+ta1}$ is obtained. After a second time shift by ta=ta2, the curve $H_{SH+ta1+ta2}$ is obtained.

With a first time shift of ta=T½, for example, the number of all zeros of the odd aliases is doubled. Each of these aliases now contains two zeros instead of the original one zero. If the time shift is applied again, but now with ta=T¼, a further zero will be added at periodic aliases which lie at the even frequency multiples 2f1, 6f1, 10f1, ... Thus, each of these alias regions also has two zeros instead of the original one zero.

Figure 8:
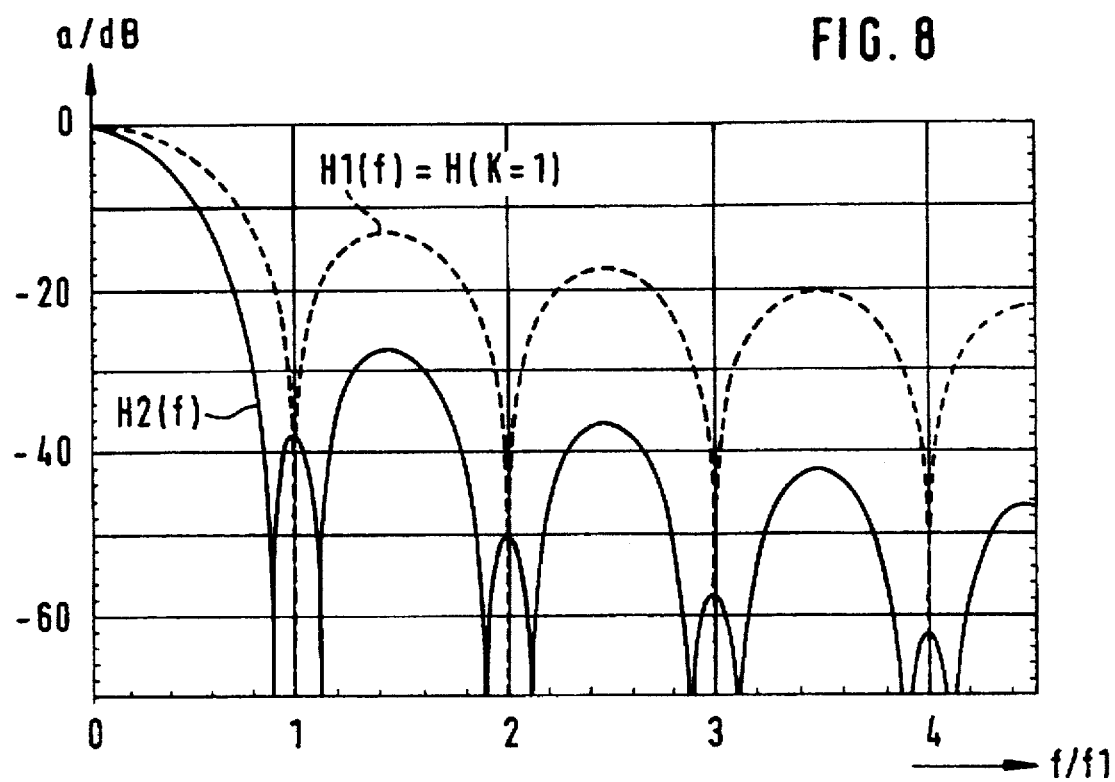
FIG. 8 shows an example of a resultant transfer function according to the third method c), which involves a shift in the frequency domain.

The above-mentioned third method c) for suppressing the alias regions is obtained if in each alias region individual zeros are positioned side by side, particularly equidistantly, by a shift in the frequency domain. This increases the relative width of the attenuation regions at the multiples of f1, whereby the necessary oversampling can be reduced. FIG. 8 shows an example in a frequency diagram. The transfer function $H1(\omega)$ of a first-order sample-and-hold circuit is modified so that a new transfer function $H_{new}(\omega)$ is formed as a product of two original transfer functions $H^{old}(\omega)$ shifted in the frequency domain:

$$H_{new}(\omega)=H2(\omega)=H1_{old}(\omega-\Delta\omega)\cdot H1_{old}(\omega+\Delta\omega)$$

As a result, the attenuation characteristic in all alias regions is changed so that the respective attenuation regions at the multiples of f1 are relatively wide. While in FIG. 8 the passband characteristic of H2(f) has relative maxima at the multiples of F1, the noise suppression in the first alias region is never below approximately −40 dB. In the second alias region, the noise suppression is already below −50 dB. If the noise suppression is to be further improved, it is necessary to modify the transfer function H(f)=H3(f) so that a third zero is positioned precisely at the center of the respective alias region:

$$H3(\omega)=H1(\omega)\cdot H2(\omega)$$

If necessary, a fourth zero and a fifth zero will be placed between the existing zeros, and so forth. This is possible with the method described in the following. The resultant impulse response h2(t) is formed by an inverse Fourier transform as follows:

$$h2(t)=\sin(\pi\omega1)/\omega1\cdot\sigma(t)+\{\sin[(2T1-t)\cdot\omega]-\sin(\pi\omega1)\}/\omega1\cdot\sigma(t-T1)+\sin[(2T1-t)\cdot\omega1]/\omega1\cdot\sigma(t-2T1)$$

Figure 9:
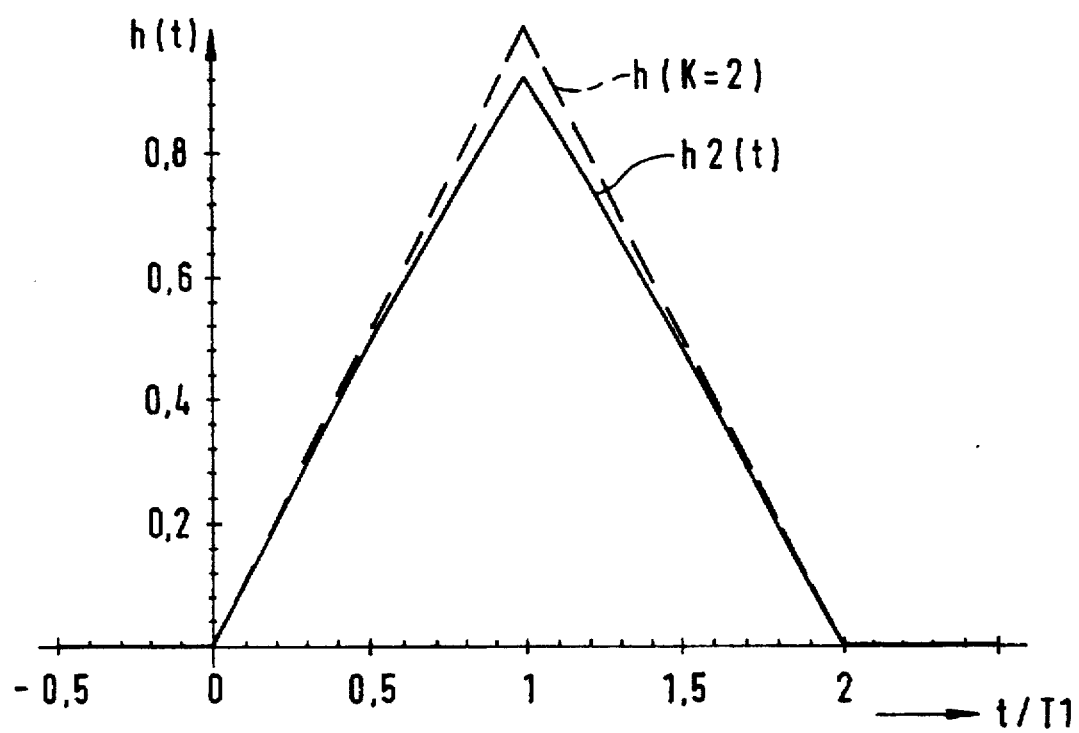
FIG. 9 shows the impulse response for the frequency shift.

The associated impulse response h2(t) is shown in FIG. 9. It bears a strong resemblance to the impulse response h(K=2) of the linear interpolator—it has approximately the form of an isosceles triangle, but unlike in the case of the linear interpolator h(K=2), the two lateral sides are curved slightly convexly. This is due to the above described sine function of the impulse response.

Figure 10:
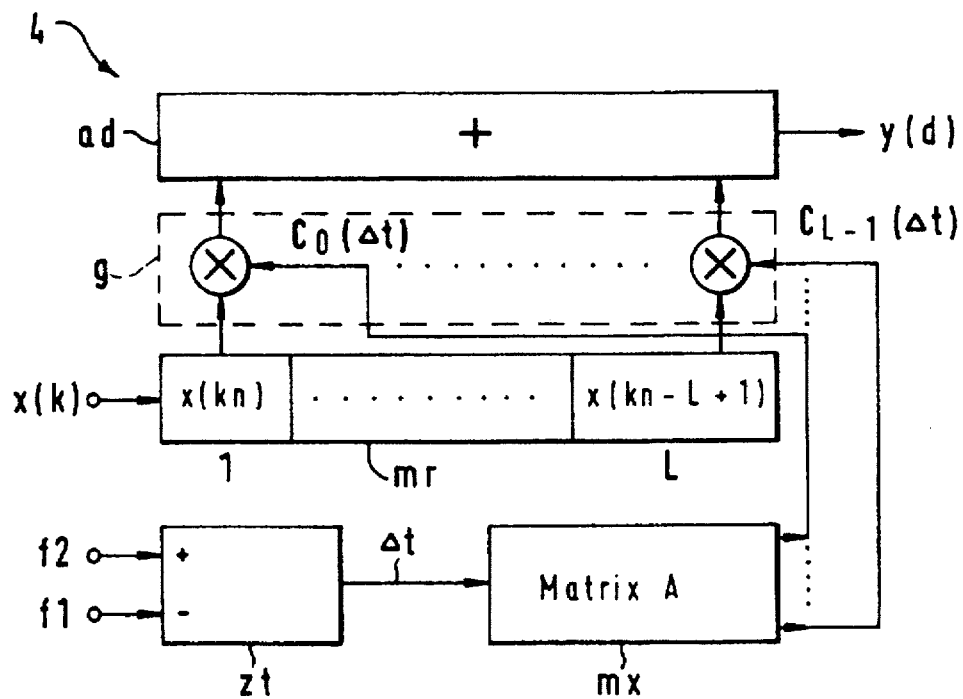
FIG. 10 is a block diagram showing an implementation of the second interpolation filter similar to an FIR filter.

FIG. 10 shows a block diagram of an arrangement for implementing the interpolation filter 4. The arrangement corresponds to known traversal-filter arrangements with time-dependent coefficients. It includes a memory device mr, which stores a given number 1 to L or kn to kn-L+1 of sample values of the first sampling sequence x(k). These values are multiplied by weighting factors $C_0$ to $C_{L-1}$ in a weighting device g, and the products thus obtained are added in an adding device ad.

The respective weighting factors are formed from the time-shifted impulse response according to the following equation:

$$C_l(dt)=h(l\cdot T1+dt) \text{ with } l=0, 1, 2, \ldots, L-1$$

Figure 13:
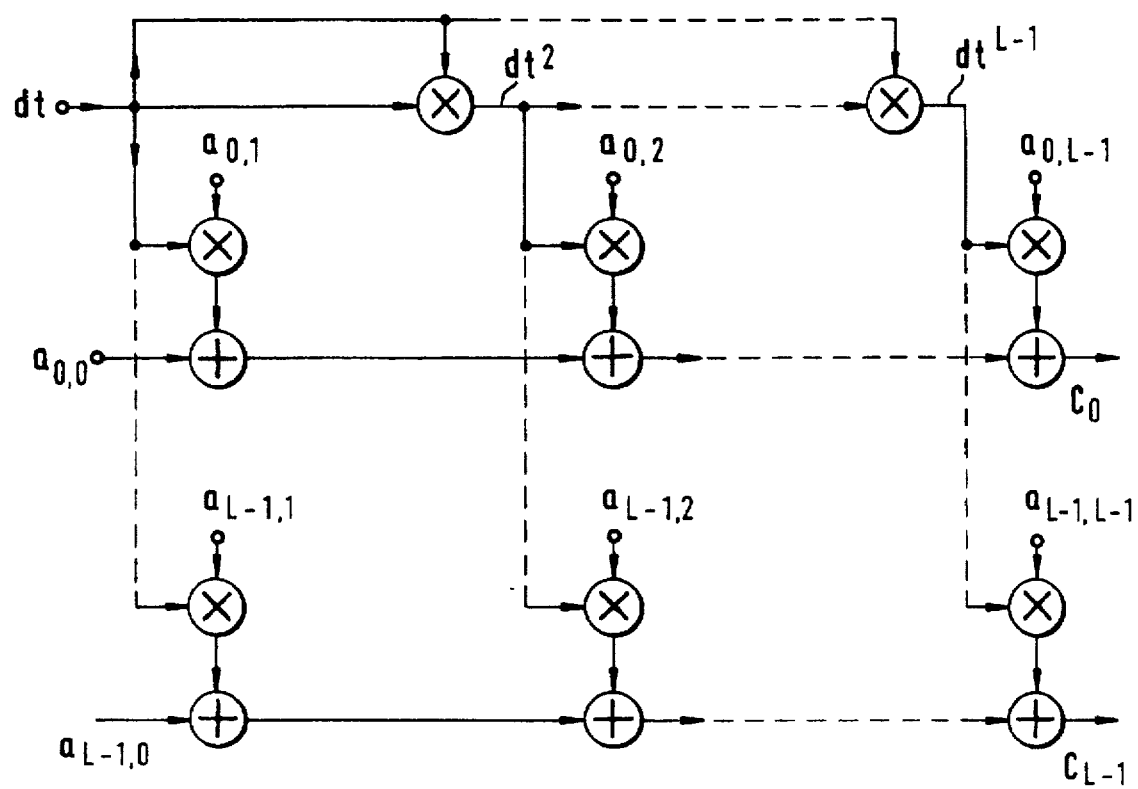
FIG. 13 shows schematically how the various weighting factors are formed in a matrix as a function of a time-difference value.

According to the invention unlike in the prior art methods, the time-dependent weighting factors (co-efficients) are not taken from a stored table or determined by means of an extensive calculation but are formed in a simple manner by means of a matrix mx, whose circuit is shown in detail in FIG. 13. This implementation is only possible for the impulse responses according to the novel methods a) and b), since these provide polynomial functions in sections.

The time-difference value dt is fed to a matrix stage mx, in which all components of the weighting factors $C_i$ and $C_1$ are formed. The individual matrix values, e.g., the constants $a_{0,0}$ to $a_{L-1,L-1}$ in FIG. 13, are read from a memory device, multiplied by the respective time-difference value dt or the corresponding power of dt, $dt^2$, $dt^3$, ... and added up to obtain the time-dependent weighting factors $C_0(dt)$ to $C_{L-1}(dt)$.

Figure 11:
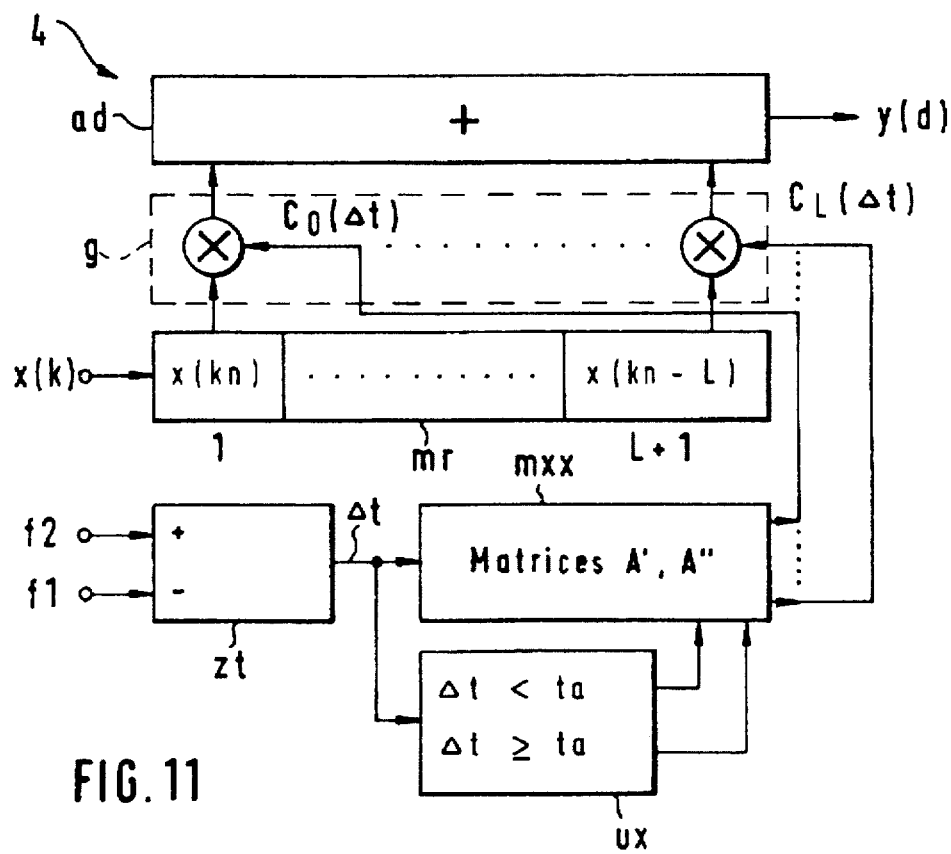
FIG. 11 is a block diagram of a preferred embodiment of the interpolation filter with a switchable matrix.

FIG. 11 shows a particularly advantageous circuit arrangement for the interpolation filter 4, which includes a changeover, device ux and an extended matrix stage mxx. This embodiment of the interpolation filter 4 proves advantageous if the transfer function H(f) is to achieve an additional zero by the second method b. For example, the two linear sections of the linear interpolation can each be described as a straight line. This eases the computational burden for calculating the respective weighting factors. In FIG. 11, the matrix stage mxx contains the two matrices A' and A", which correspond to the sections dt<ta and dt≧ta. FIG. 6 shows, by way of example, an impulse response h2ta(t) which is composed of straight sections. The stored sample values in FIG. 11 comprise L+1 sample values from 1 to L+1. The stored sample values corresponding to them are x(kn) to x(kn-L).

The determination of the weighting factors $C_0$, $C_1$, $C_2$, corresponding to the time-difference value dt, will now be explained with reference to the modified impulse response h2ta(t) of FIG. 6, the calculation being performed section by section. To this end, the impulse response h2ta(t) is divided into five sections. Outside these sections, the impulse response has the value zero.

1st section from 0<t<ta: h(t)=t
2nd section from ta<t<1: h(t)=−ta+2t
3rd section from 1<t<1+ta: h(t)=2−ta
4th section from 1+ta<t<2: h(t)=4+ta−2t
5th section from 2<t<2+ta: h(t)=2+ta−t For the subsequent calculation of the weighting factors, the following equations hold: $C_1(dt)=h(1+dt)$, with the running parameter l=0, 1, 2, ... and $$h(t)=h_{old}(t)+h_{old}(t-ta)$$

The impulse response h2ta (t) has a discontinuity at each of the frequency values 0f1, 1f1, and 2f1. Since there is also a discontinuity at each of the time values 0+ta, T1+ta, and 2T1+ta, the mathematical description of the straight intermediate portions up to the respective time value ta is much simpler in sections. This is shown by the above five simple impulse responses h(t). They provide the following weighting factors for the five possible time ranges of dt within the impulse response:

$0 < dt < ta$     $ta < dt < 1$ $C_1(dt) = dt$     $C_1(dt) = -ta + 2dt$ $C_1(dt) = 2 - ta$     $C_1(dt) = 2 + ta - 2dt$ $C_1(dt) = ta - dt$     $C_1(dt) = 0$

For the matrices A' and A", this gives the following switchable coefficients or matrix values, which are read as factors for the subsequent multiplication or as time-independent values from a memory device:

$$A' = \begin{bmatrix} 0 & 1 \\ 2-ta & 0 \\ ta & -1 \end{bmatrix} \quad A'' = \begin{bmatrix} -ta & 2 \\ 2+ta & -2 \\ 0 & 0 \end{bmatrix}$$

For the third method c), involving a shift in the frequency domain, the weighting factors cannot be calculated by means of a matrix arrangement as in FIG. 10 or FIG. 11, but it is necessary to calculate sine values or to take these values from a stored sine table, since the necessary sine values cannot be approximated by a simple polynomial series—if this were possible, the polynomial series, and thus the matrix solution, would be used direct.

Figure 12:
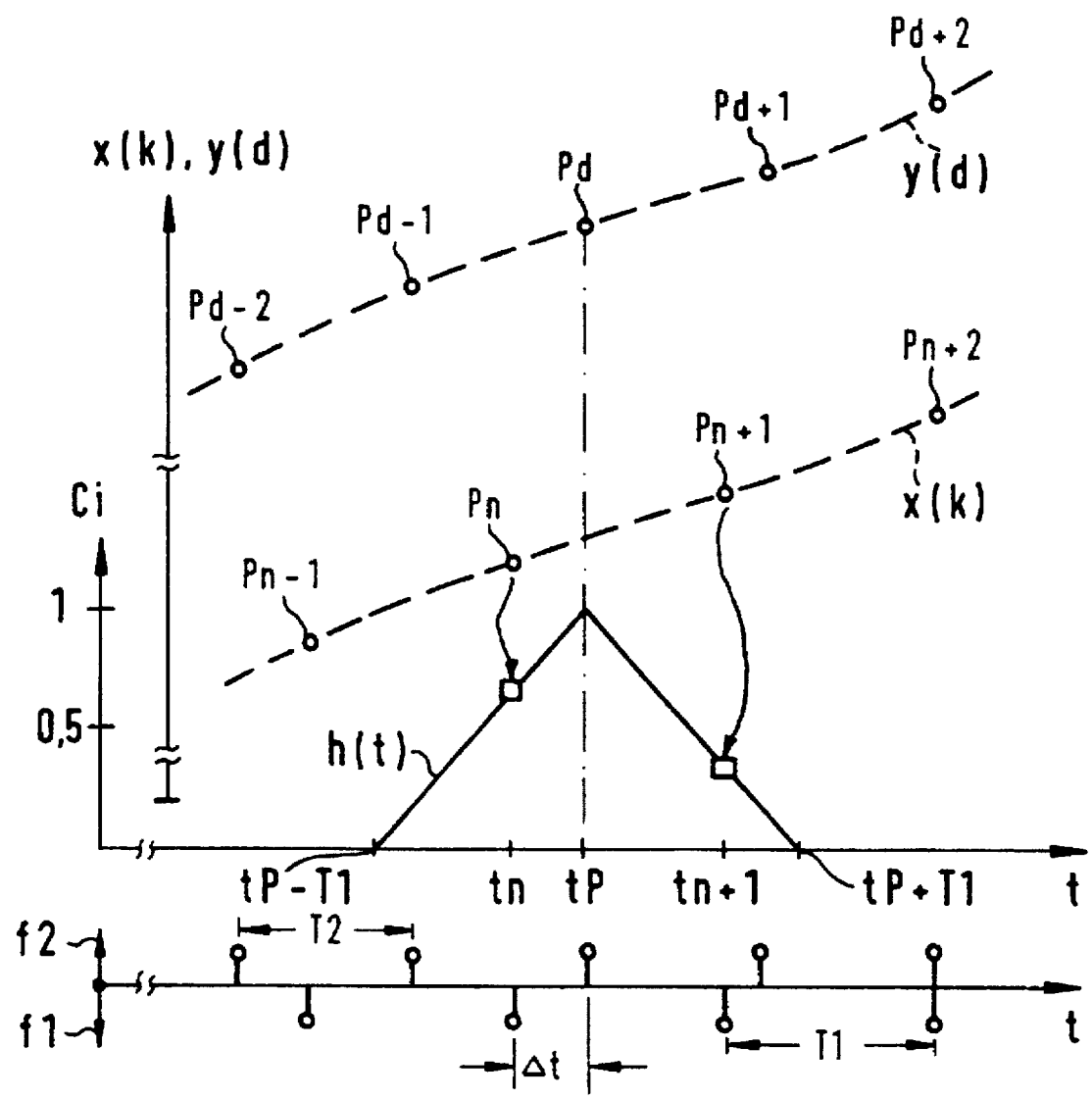
FIG. 12 is a schematic timing diagram illustrating the conversion of a first sampling sequence into an arbitrary second sampling sequence.

FIG. 12 shows in more detail than FIG. 2 how a second sampling sequence y(d) with an arbitrary frequency ratio is generated from a first sampling sequence x(k). The required sample value Pd, which is associated with the interpolating or sampling instant tP, is formed by, preferably polynomial, interpolation for the first sampling sequence x(k). To this end, the time-difference value dt is determined from the nearest sample value Pn of the first sampling sequence x(k) and the desired sampling instant tP. According to this time-difference value tP, the weighting factors Ci are determined from the transfer function h(t). The memory device mr makes available the necessary sample values Pn and Pn+1 for the interpolation calculation of Pd. The calculation of the preceding and subsequent sample values Pd–2 to Pd+2 is performed in a similar manner by shifting the interpolation window and determining the respective time-difference value.

The invention is also suitable for implementing those numerical ratios at which the least common frequency multiple of the two clocks is at an undesirably high frequency.

It will be understood that the embodiment described herein is merely exemplary and that a person skilled in the art may make many variations and modifications without departing from the spirit and scope of the present invention. All such modifications are intended to be included within the scope of the present invention as defined in the appended claims.

What is claimed is:

1. A method for digital interpolation of signals comprising the steps of:

receiving a digital signal input value sequence x(k) corresponding to an analog signal sampled at a predetermined frequency;

locking delayed input values of said digital sequence x(k) to a first clock signal, said first clock signal having an interpolating instant and a time grid;

determining weighting factors by means of an impulse response in a time domain with a transfer function in a frequency domain having an attenuation characteristic which, with respect to stop bands, is limited to alias regions located at frequency multiples of said first clock signal;

multiplying said locked delayed input values by said corresponding weighting factors;

determining a time-difference value as a function of said interpolating instant and said time grid;

adding said multiplied values wherein said values depend on said time-difference value to produce a second digital signal sequence y(d) at a second sampling rate;

wherein each of said alias regions is assigned at least two zeros of said transfer function in the frequency domain, said at least two zeros in each alias region lying side by side of if two zeros lie on top of one another as a second-order zero, at least one of said alias regions assigned at least one further zero of said transfer function; wherein said impulse response is dependent on said time difference value.

2. The method as recited in claim 1 further comprising the step of determining a new impulse response whose first further zero of said transfer function in the frequency domain is located at a predetermined frequency, said new impulse response at a time t determined by adding an original impulse response at said time t to an original impulse response at a time t minus half said predetermined frequency.

3. The method as recited in claim 2 wherein additional zeros of said transfer function are arbitrarily positioned by repeating the step of determining a new impulse response.

4. The method as recited in claim 1 wherein said each of said alias regions is assigned at least one further zero of said transfer function in the frequency domain such that all alias regions have at least three zeros.

5. The method as recited in claim 4 wherein at least three zeros are located at centers of respective alias regions at frequency multiples of said first clock signal.

6. The method as recited in claim 5 wherein said impulse response, of a sample-and-hold function with centrally located zeros which are at least of the third order, is defined by:

$$hn(t) = \frac{1}{(n-1)!} \times \sum_{k=0}^{n} \left[ \binom{n}{k} \times (-1)^k \times (t - kT1)^{n-1} \times \sigma(t - kT1) \right]$$

wherein n is an order of the central zeros of the associated transfer function in each alias region;

k is a running numerical value for addition, which assumes values zero to n;

σ(t) is a unit step at instant t; and

σ(t–kT1) is a unit step at instant t–kT1.

7. A method for digital interpolation of signals comprising the steps of:

receiving a digital signal input value sequence x(k) corresponding to an analog signal sampled at a predetermined frequency;

multiplying delayed input values of said digital sequence (x(k)) locked to a first clock signal (f1) by corresponding weighting factors (Ci: $C_i$) and adding up the multiplied values, which are depending on a time-difference value (Δt; dt) which is determined by an interpolating instant (tP) and a time grid of the first clock signal (f1), to produce a second digital signal sequence y(d) at a second sampling rate;

wherein the weighting factors (Ci: $C_i$) are determined by means of an impulse response h(t) in the time domain, with the transfer function H(f) in the frequency domain, having an attenuation characteristic which, with respect to the stop bands, is limited essentially to the alias regions (1S, 2S, ... pS, ...) located at the frequency multiples of the first clock signal (f1); wherein each of said alias regions is assigned at least two zeros of the transfer function H(f) in the frequency domain, the at least two zeros in each alias region lying side by side or at least one of the alias regions (pS) being assigned at least one further zero of the transfer function H(f) if the two zeros lie on top of one another as a second-order zero (K=2);

wherein the impulse response for calculating the weighting factors is defined in sections with respect to the time-difference value.

8. The method as recited in claim 7, wherein a new impulse response h(t) whose first further zero of the transfer function H(f) in the frequency domain is to be located at a predetermined frequency fn is formed from an original impulse response $h_{old}(t)$ as follows:

$$h(t)=h_{new}(t)=h_{old}(t)+h_{old}(t-ta) \text{ with } ta=\tfrac{1}{2}fn.$$

9. The method as recited in claim 7, wherein additional further zeros of the transfer function H(f) can be arbitrarily positioned by repeated use of a new impulse response h(t) whose first further zero of the transfer function H(f) in the frequency domain is to be located at a predetermined frequency fn is formed from an original impulse response $h_{old}(t)$ as follows:

$$h(t)=h_{new}(t)=h_{old}(t)+h_{old}(t-ta) \text{ with } ta=\tfrac{1}{2}fn.$$

10. The method as recited in claim 7, wherein each alias region (1S, 2S, ... pS, ...) is assigned at least one further zero of the transfer function H(f) in the frequency domain, so that all alias regions have at least three zeros.

11. The method as recited in claim 10, wherein at least three zeros are located at the centers of the respective alias regions (1S, ... pS, ...) at the frequency multiples (1f1, 2f1, ... pf1, ...) of the first clock signal (f1).

12. The method claimed in claim 11, wherein the impulse response h(t) of a sample-and-hold function hn(t) or h(K=n) with centrally located zeros which are at least of the order K=n=3 is defined by:

$$hn(t) = \frac{1}{(n-1)!} \times \sum_{k=0}^{n} \left[ \binom{n}{k} \times (-1)^k \times (t-kT1)^{n-1} \times \sigma(t-kT1) \right]$$

wherein n is the order of the central zeros of the associated transfer function Hn(f) in each alias region 1S, 2S, ... pS, ...;

k is the running numerical value for the addition, which assumes the values zero to n;

σ(t) is the unit step at instant t; and

σ(t−kT1) is the unit step at instant t−kT1.

13. The method as recited in claim 12, wherein a new impulse response h(t) whose first further zero of the transfer function H(f) in the frequency domain is to be located at a predetermined frequency fn is formed from an original impulse response $h_{old}(t)$ as follows:

$$h(t)=h_{new}(t)=h_{old}(t)+h_{old}(t-ta) \text{ with } ta=\tfrac{1}{2}fn.$$

14. The method as recited in claim 12, wherein additional further zeros of the transfer function H(f) can be arbitrarily positioned by repeated use of a new impulse response h(t) whose first further zero of the transfer function H(f) in the frequency domain is to be located at a predetermined frequency fn is formed from an original impulse response $h_{old}(t)$ as follows:

$$h(t)=h_{new}(t)=h_{old}(t)+h_{old}(t-ta) \text{ with } ta=\tfrac{1}{2}fn.$$

15. The method as recited in claim 7, wherein a new transfer function $H_{new}(f)$ is formed from an original transfer function $H_{old}(f)$ by a shift in the frequency domain by the frequency values +Δf and −Δaf according to the following formula:

$$H_{new}(f)=H_{old}(f-\Delta f) \cdot H_{old}(f+\Delta f),$$

whereby the respective stop band is widened as compared with a central zero position.

16. The method as recited in claim 15, wherein additional zeros of the transfer function are generated by repeating the step of forming a new transfer function from an original transfer function by a shift in the frequency domain.

17. The method as recited in claim 7, wherein the weighting factors are formed by means of a matrix stage.

18. The method as recited in claim 7, wherein the impulse response is implemented with an FIR filter structure, the weighting factors being formed by means of a matrix stage.

19. The method as recited in claim 19, wherein the weighting factors are formed by means of a switchable matrix stage.

* * * * *